(12) United States Patent
Kunze et al.

(10) Patent No.: US 9,016,230 B2
(45) Date of Patent: Apr. 28, 2015

(54) METHOD AND ASSEMBLY FOR TREATING A PLANAR MATERIAL TO BE TREATED AND DEVICE FOR REMOVING OR HOLDING OFF TREATMENT LIQUID

(75) Inventors: Henry Kunze, Wendelstein (DE); Ferdinand Wiener, Burgthann (DE)

(73) Assignee: Atotech Deutschland GmbH, Berlin (DE)

( * ) Notice: Subject to any disclaimer, the term of this patent is extended or adjusted under 35 U.S.C. 154(b) by 498 days.

(21) Appl. No.: 13/320,504

(22) PCT Filed: May 12, 2010

(86) PCT No.: PCT/EP2010/002939
§ 371 (c)(1),
(2), (4) Date: Jan. 27, 2012

(87) PCT Pub. No.: WO2010/130445
PCT Pub. Date: Nov. 18, 2010

(65) Prior Publication Data
US 2012/0111365 A1    May 10, 2012

(30) Foreign Application Priority Data

May 13, 2009 (DE) .......................... 10 2009 021 042

(51) Int. Cl.
*B05C 11/06* (2006.01)
*H05K 3/00* (2006.01)
(Continued)

(52) U.S. Cl.
CPC ................ *H05K 3/0085* (2013.01); *B05C 3/09* (2013.01); *B05C 11/06* (2013.01); *C25D 7/0621* (2013.01);
(Continued)

(58) Field of Classification Search
CPC ........ B05C 3/09; B05C 11/06; B65G 21/109; B65G 39/04; B65H 5/062; B65H 2404/14; B65H 2404/133; H05K 13/0061; H05K 3/0085; H05K 2203/0413; H05K 2203/0746; H05K 2203/1509; H05K 2203/1572; C25D 7/0621; C25D 7/0642; C25D 17/00; C25D 21/10
USPC .............. 118/62, 63, 404, 405, 407, 419, 428
See application file for complete search history.

(56) References Cited

U.S. PATENT DOCUMENTS 3,779,206 A   12/1973   Sato et al.
4,445,992 A    5/1984   Yamamoto
(Continued)

FOREIGN PATENT DOCUMENTS

CN      1638604 A   7/2005
CN    100466882 C   3/2009
(Continued)

*Primary Examiner* — Laura Edwards
(74) *Attorney, Agent, or Firm* — Mintz Levin Cohn Ferris Glovsky and Popeo, P.C.; Peter F. Corless; Steven M. Jensen

(57) ABSTRACT

In order to remove treatment liquid (21) from a planar material to be treated (10), which is transported in an assembly for wet-chemical treatment of the material to be treated (10), a retaining surface (4, 14) is provided for holding back the treatment liquid (21). The retaining surface (4, 14) is arranged relative to a transport path of the material to be treated (10) so that a gap (8, 18) remains between the retaining surface (4, 14) and a surface of the material to be treated (10) opposing the retaining surface (4, 14), when the material to be treated (10) is moved past the retaining surface (4, 14). The retaining surface (4, 14) may, for example, be provided as an offset portion of a peripheral surface of a roll (2, 3).

14 Claims, 8 Drawing Sheets

(51) Int. Cl.
    *B05C 3/09*         (2006.01)
    *C25D 7/06*         (2006.01)
    *C25D 17/00*       (2006.01)
    *C25D 21/10*       (2006.01)

(52) U.S. Cl.
    CPC ............. *C25D 7/0642* (2013.01); *C25D 17/00* (2013.01); *C25D 21/10* (2013.01); *H05K 2203/0143* (2013.01); *H05K 2203/0746* (2013.01); *H05K 2203/1509* (2013.01); *H05K 2203/1572* (2013.01)

(56) References Cited

U.S. PATENT DOCUMENTS

| | | |
|---|---|---|
| 4,776,939 A | 10/1988 | Blasing et al. |
| 4,800,001 A | 1/1989 | Ott et al. |
| 4,859,298 A | 8/1989 | Senge et al. |
| 5,007,445 A | 4/1991 | Pender |
| 5,313,685 A | 5/1994 | Kramer et al. |
| 5,556,532 A | 9/1996 | Markowski |
| 6,174,418 B1 | 1/2001 | Ohba |
| 6,440,215 B1 * | 8/2002 | Lymn et al. ............ 118/62 |
| 7,033,468 B2 | 4/2006 | Hubel |
| 2005/0103601 A1 * | 5/2005 | Hubel ............ 198/780 |
| 2008/0142358 A1 | 6/2008 | Schmid |
| 2010/0126829 A1 | 5/2010 | Nicolet |

FOREIGN PATENT DOCUMENTS

| | | |
|---|---|---|
| DE | 2202673 A1 | 8/1972 |
| DE | 3603856 A1 | 8/1987 |
| DE | 3624481 A1 | 1/1988 |
| DE | 4337811 A1 | 5/1995 |
| DE | 4337988 A1 | 5/1995 |
| DE | 19519211 A1 | 11/1996 |
| DE | 19522733 A1 | 1/1997 |
| DE | 19539606 A1 | 5/1997 |
| DE | 19717512 A1 | 10/1998 |
| DE | 19802755 A1 | 7/1999 |
| DE | 19939740 A1 | 9/2000 |
| DE | 10019713 A1 | 10/2001 |
| DE | 10206660 C1 | 7/2003 |
| DE | 10358149 B3 | 5/2005 |
| DE | 102005039100 A1 | 2/2007 |
| DE | 102007035086 B3 | 10/2008 |
| DE | 10 2007 038 116 A1 | 2/2009 |
| EP | 0513632 A1 | 11/1992 |
| EP | 0652982 A1 | 5/1995 |
| EP | 0741804 A1 | 11/1996 |
| EP | 0752807 A1 | 1/1997 |
| GB | 2288381 * | 10/1995 |
| JP | 07-245462 | 9/1995 |
| JP | 08-294678 | 11/1996 |
| JP | 09-326342 | 12/1997 |
| JP | 09-331135 | 12/1997 |
| JP | 2002-096038 | 4/2002 |
| JP | 2005-103601 | 4/2005 |
| JP | 2008-085119 | 4/2008 |
| JP | 2008-137733 | 6/2008 |
| JP | 2009-221580 | 10/2009 |
| WO | 96/38028 | 11/1996 |

* cited by examiner

METHOD AND ASSEMBLY FOR TREATING A PLANAR MATERIAL TO BE TREATED AND DEVICE FOR REMOVING OR HOLDING OFF TREATMENT LIQUID

CROSS-REFERENCES TO RELATED APPLICATIONS

This application is a 35 U.S.C. §371 U.S. national entry of International Application PCT/EP2010/002939 (WO 2010/130445) having an International filing date of May 12, 2010, which claims under 35 U.S.C. §119 the benefit of German Patent Application No. 10 2009 021 042.3, filed May 13, 2009. The entire contents of both applications are incorporated herein by reference in their entirety.

The invention relates to a method and an assembly for treating a planar material to be treated and a device for removing or holding off treatment liquid from a planar material to be treated. In particular, the invention relates to such methods, assemblies and devices which permit a treatment of material to be treated having a sensitive surface or a plurality of sensitive surfaces. The invention also relates to such methods, assemblies and devices in which contact between a useful region of the material to be treated and fixed elements may be substantially avoided, when liquid is removed from the material to be treated.

When processing planar material to be treated, such as for example circuit boards in the circuit board industry, the material to be treated is frequently treated in a wet-chemical process line. In order to remove treatment liquid, such as a process chemical or water, so-called nip rolls may be used. Such rolls may, for example, be used in order to accumulate treatment liquid for immersion treatment in a treatment station, as is disclosed in DE 43 37 988 A1.

FIG. 9 is a schematic view of a treatment station 200 in which the liquid level of the treatment liquid is higher than a transport plane of the material to be treated 203, so that the material to be treated 203 may be transported immersed. The material to be treated 203 is transported in a horizontal transport direction 204 through the treatment station. For transporting the material to be treated, roll pairs 211-216 are provided which come to bear against the surfaces of the material to be treated 203 facing upwards and/or downwards, in order to transport said material to be treated. In order to avoid the escape of treatment liquid, an inner container 201 is provided in which the treatment liquid is accumulated up to the upper level (not shown). The inner container 201 is enclosed by an outer container 202 so that the outer container 202 collects the treatment liquid overflowing out of the inner container 201. From the treatment liquid 208 collected in the outer container 202, which has a level 209 in the outer container, the treatment liquid is pumped by a pump 210 back into the inner container 201. The treatment liquid may be discharged via flow nozzles 206, 207 or the like back into the inner container 201.

For accumulating the treatment liquid in the inner container 201 pairs of so-called nip rolls 213, 215 are used in the inflow region and outflow region of the inner container 201. The pairs of nip rolls 213, 215 may, for example, have a cylindrical peripheral surface. If the nip rolls 213a, 213b of the pair 213 and the nip rolls of the roll pair 215 bear against the material to be treated 203, the free cross section through which the treatment liquid may escape from the inner container 201 is restricted. By corresponding adjustment of the delivery rate of the pump 210, a desired level of treatment liquid in the inner container 201 may be set. Additional roll pairs, such as the roll pairs 211, 212, 214 and 216 in the inflow region or outflow region of the treatment station may also act as nip rolls.

If the material to be treated 203 has one or more sensitive surfaces, however, the direct contact between the nip roll pairs 213, 215 and the material to be treated 203, which is over the entire width in conventional nip rolls, i.e. the entire extension transversely to the transport direction 204, of the material to be treated 203, may lead to damage to the surface of the material to be treated 203. Damage to the surfaces of the material to be treated 203 may, for example, be caused by the surface pressure or particles adhering to the surfaces of the nip rolls 213, 215 and surface unevenness.

The object of the invention is to provide a method and an assembly for treating a planar material to be treated and a device for removing or holding off treatment liquid for an assembly for treating planar material to be treated, in which the risk of damage to sensitive surfaces of the material to be treated may be reduced. The object of the invention is further to provide a method for producing circuit boards, in which the risk of damage to sensitive surface regions of the circuit board may be reduced.

According to the invention, the object is achieved by a method and an assembly for treating a planar material to be treated and a device for removing or holding off treatment liquid, as set forth in the independent claims. The dependent claims define preferred and advantageous embodiments of the invention.

The method for treating a planar material to be treated, which is transported in an assembly for wet-chemical treatment of the material to be treated along a transport path, provides that a retaining surface is provided for holding back a treatment liquid, to which the material to be treated is subjected in the assembly. The retaining surface is positioned on the transport path, so that a gap remains between the retaining surface and a surface of the material to be treated, when the material to be treated is moved past the retaining surface.

A surface which, due to its design and arrangement, may restrict a flow of liquid in at least one direction, in particular in a transport direction of the material to be treated is denoted as a retaining surface for holding back treatment liquid. The retaining surface does not have to completely prevent the liquid flow but may permit the passage of treatment liquid, in particular through the gap formed.

As the retaining surface is positioned so that between the retaining surface and a surface of the material to be treated a gap remains when the material to be treated is moved past the retaining surface, the portion of material to be treated on which the gap is arranged does not come into contact with the retaining surface. The retaining surface may, in particular, be designed so that the gap extends along a useful region of the material to be treated so that the retaining surface does not come into contact with the useful region of the material to be treated.

The retaining surface may be designed and arranged so that the retaining surface does not come into contact with a useful region of the material to be treated which extends continuously between opposing edge regions of the material to be treated. The retaining surface may be designed and arranged so that the retaining surface is spaced apart from the entire useful region of the material to be treated. The retaining surface may be designed and arranged so that the gap in one direction extends transversely to the transport direction of the material to be treated continuously over the entire useful region of the material to be treated when the material to be treated is moved past the retaining surface.

The gap may have a minimum gap height. The minimum spacing between the retaining surface and the material to be treated moved past the retaining surface is denoted as the minimum gap height. At least on one side of the retaining surface the treatment liquid may be accumulated up to a level which is higher than the minimum gap height of the gap. The material to be treated may thus be transported immersed in the treatment liquid on at least one side of the retaining surface. The retaining surface may reduce the liquid level on the material to be treated and/or remove treatment liquid from the material to be treated if, for example, the material to be treated is moved past an outflow region of a treatment station on the retaining surface.

The minimum gap height may be less than 1 mm, in particular less than 0.7 mm, in particular less than 0.5 mm. The minimum gap height may be at least 0.05 mm, in particular at least 0.07 mm, in particular at least 0.09 mm.

A treatment liquid passing through the gap may be removed from the material to be treated by a fluid flow, for example blown away by a gas flow. By the combination of the gap-forming retaining surface and the blowing away of treatment liquid, a removal of treatment liquid may be achieved even when treatment liquid passes through the gap.

A second retaining surface which is spaced apart from the retaining surface may be provided in order to remove treatment liquid passing through the gap from the material to be treated. Thus in an inflow region of a treatment station or in an outflow region of a treatment station between the retaining surface and the second retaining surface, the treatment liquid may be accumulated up to a level which is lower than the level of the treatment liquid in an operating region of the treatment station. In this manner, a series of levels in the manner of a cascade may be produced.

For removing the treatment liquid by a fluid flow, the fluid flow may be directed towards the material to be treated. Said fluid flow may be oriented so that it does not pass through the gap. Additionally, a volume flow or one or more of a volume flow, a flow speed and a flow direction of the fluid flow may be adjusted so that the fluid flow does not pass through the gap, i.e. for example does not enter the accumulated treatment liquid.

The fluid flow used for removing treatment liquid may flow onto the material to be treated in a direction which has a component oriented transversely to the transport direction and parallel to the transport plane of the material to be treated. Thus the treatment liquid may be removed from the material to be treated transversely to the transport direction.

The retaining surface may be formed on a roll. The roll may extend along the material to be treated in the width direction, i.e. transversely to the transport direction of the material to be treated. The roll may be arranged so that its axis extends parallel to the transport plane. If the material to be treated is transported in a horizontal transport plane, the roll may be provided above or below the transport plane. The roll may be configured so that the roll surface is spaced apart from the entire useful region of the material to be treated.

The roll may be set in rotation so that the part of the roll surface which defines the gap on one side, moves in a direction which opposes the transport direction of the material to be treated. In this manner, for example, the escape of treatment liquid may be further reduced in an outflow region of a treatment station. Also, the exchange of material on the surface of the material to be treated may be improved.

By means of the roll, not only the treatment liquid may be held back or accumulated but also the material to be treated may be transported in the transport direction. On the roll at least one transport portion may be provided which is coupled to the material to be treated, in order to transport the material to be treated. The retaining surface may be provided offset relative to the transport portion in order to form the gap.

The transport portion may be rotated for transporting the material to be treated. In one embodiment, the transport portion may be rotated relative to the retaining surface in order to permit an independent rotation of the transport portion and retaining surface.

On opposing sides of the gap in the transport direction of the material to be treated, a difference in the levels of the treatment liquid may be set. Treatment liquid may be present on the material to be treated on both sides of the gap. For example, in an inflow region or in an outflow region of a treatment station for the material to be treated, the level of the treatment liquid on the retaining surface may be altered in a stepped manner in order to achieve a desired liquid level in the treatment region.

The retaining surface may be rotated in order to reduce or prevent the passage of treatment liquid through the gap. To this end, the retaining surface may be designed and the rotational speed of the retaining surface may be selected so that the displacement of treatment liquid through the rotating retaining surface reduces or prevents the flow of the treatment liquid through the gap.

The treatment liquid may be accumulated by the retaining surface in a treatment station so that the material to be treated is transported in the treatment station immersed in the treatment liquid. The immersed transportation of the material to be treated may be used, in particular, for treating thin material to be treated with low inherent rigidity.

The material to be treated may be a film-like material, in particular a film-like circuit board or conductor foil. The material to be treated may also be a continuous material.

The device provided according to one aspect of the invention for removing or holding off treatment liquid from a planar material to be treated for an assembly for wet-chemical treatment of the material to be treated comprises a retaining surface for holding back the treatment liquid. The device is designed to be arranged relative to a transport path of the material to be treated so that the device forms a gap between the retaining surface and a surface of the material to be treated transported along the transport path.

The terms "removal of" or "holding off" treatment liquid are thus used in the sense that the device is designed to retain the treatment liquid at least partially, without the treatment liquid having to be completely removed or held off.

As the device is designed to be positioned so that a gap remains between the retaining surface and a surface of the material to be treated, the portion of material to be treated on which the gap is formed does not come into contact with the retaining surface. The device may, in particular, be designed so that the gap extends along a useful region of the material to be treated, so that the retaining surface does not come into contact with the useful region of the material to be treated.

The gap may have a minimum gap height. The minimum spacing between the retaining surface and the material to be treated moved past the retaining surface is denoted as the "minimum gap height". The device may be designed so that on at least one side of the retaining surface the treatment liquid may be accumulated up to a level which is higher than the minimum gap height of the gap. The material to be treated may thus be transported on the side of the retaining surface immersed in the treatment liquid.

The minimum gap height may be less than 1 mm, in particular less than 0.7 mm, in particular less than 0.5 mm. The minimum gap height may be at least 0.05 mm, in particular at least 0.07 mm, in particular at least 0.09 mm.

The device may comprise a flow device spaced apart from the retaining surface which is designed to cause a fluid flow to flow onto the material to be treated in order to remove the treatment liquid from the material to be treated. By means of the flow device, treatment liquid emerging through the gap may be removed.

The flow device may be designed to produce the fluid flow with a speed component which is oriented parallel to the transport plane and transversely to the transport direction of the material to be treated. By a flow device designed in such a manner, the treatment liquid may be removed from the material to be treated transversely to the transport direction.

The flow device may be designed and arranged so that the fluid flow does not pass through the gap. To this end, a volume flow or one or more of a volume flow, a flow speed and a flow direction of the fluid flow may be designed in an appropriate manner so that the fluid flow does not pass through the gap into the accumulated treatment liquid. In this manner, the formation of bubbles, for example in the accumulated treatment liquid, may be reduced or prevented by the fluid flow.

The device may comprise a further retaining surface, the device being designed to be arranged relative to the transport path of the material to be treated, so that the device forms a further gap between the further retaining surface and a further surface of the material to be treated transported along the transport path. The retaining surface and the further retaining surface may, for example, face opposing surfaces of the material to be treated in order to remove liquid therefrom. The retaining surface and the further retaining surface may be provided on rolls of a roll pair, between which the material to be treated is transported.

The device may be designed so that the treatment liquid may pass through the gap. When the passage of a small flow of treatment liquid through the gap is tolerated, in particular, measures for completely preventing the passage of treatment liquid may be dispensed with.

The retaining surface may be formed on a rotatably mounted roll of the device. The roll may be configured such that the roll surface is spaced apart from the entire useful region of the material to be treated.

The device may comprise a drive device which is designed to set the roll in rotation so that the part of the roll surface which defines the gap on one side, moves in a direction which is opposed to the transport direction of the material to be treated. In this manner, for example, in an outflow region of a treatment station, the escape of treatment liquid may be further reduced. Also the exchange of material on the surface of the material to be treated may be improved.

The roll may be designed so that it may be used not only for holding back the treatment liquid by means of the retaining surface but also for transporting the material to be treated. To this end, at least one transport portion may be provided on the roll, which are configured to be coupled with the material to be treated for transporting the material to be treated. On the roll, two transport portions may be provided for transporting the material to be treated and the retaining surface may be arranged between the at least two transport portions. For example, transport portions may be provided on axial edge portions of the roll and the retaining surface may extend between the axial edge portions. The retaining surface may be configured as a surface which is offset relative to the at least one transport portion and/or the at least two transport portions.

The roll may be designed to extend along the material to be treated in the width direction, i.e. transversely to the transport direction of the material to be treated. If the material to be treated is transported in a horizontal transport plane, the roll may be designed to be provided above or below the transport plane.

The device may be configured so that the roll may be adjusted perpendicular to a transport plane of the material to be treated, for example by providing a vertically adjustable bearing. In a device thus configured, the geometry of the gap, in particular the minimum gap height, may be adjusted.

The at least one transport portion and/or the at least two transport portions may be rotated relative to the retaining surface. The device may be designed for a rotary drive of the transport portion and/or the transport portions and a rotary drive of the retaining surface independent therefrom.

In a further embodiment, the device may comprise a cuboidal element on which the retaining surface is formed.

The device may be designed for use in the method for treating the material to be treated according to one feature or embodiment.

The assembly provided according to one aspect of the invention for treating a planar material to be treated comprises a device for removing or holding off treatment liquid from the material to be treated, which is designed as a device according to a feature or embodiment of the invention.

The assembly may comprise a plurality of such devices. For example, at least two devices may be provided spaced apart from one another in a transport direction of the material to be treated, in order to remove the treatment liquid from the material to be treated. By the use of a plurality of such devices for removing the treatment liquid, a substantial removal of treatment liquid is possible, even if liquid passes through the gaps formed by the devices. Alternatively or additionally, a plurality of devices spaced apart from one another in the transport direction of the material to be treated may also be provided in an inflow region of a treatment station, in order to accumulate the treatment liquid in the treatment station, and to reduce the escape of treatment liquid from the treatment station.

The assembly may comprise a treatment station in which the treatment liquid may be accumulated. Both in an inflow region of the treatment station and in an outflow region of the treatment station, a device for removing or holding off treatment liquid from the material to be treated may be respectively provided. By means of the devices, the treatment liquid may be accumulated in the treatment station. In the inflow region and/or in the outflow region, in each case at least two devices for removing or holding off treatment liquid may also be provided. By means of the at least two devices, the treatment liquid may be accumulated in a plurality of levels.

The assembly may be configured to rotate the retaining surface of a device provided in the inflow region of the treatment station above the transport plane and the retaining surface of a device provided in the outflow region of the treatment station above the transport plane in opposing directions. Additionally or alternatively, the assembly may be configured to rotate the retaining surface of a device provided in the inflow region of the treatment station below the transport plane and the retaining surface of a device provided in an outflow region of the treatment station below the transport plane in opposing directions. By the suitable choice of rotational directions, the passage of treatment liquid through the gaps of the devices provided in the inflow region and the outflow region may be reduced or prevented.

According to a further aspect, a method for producing a circuit board is provided. Thus it is provided to produce the circuit board from a material to be treated which has been treated by the method for treating the material to be treated according to one feature or embodiment. For example, a printed circuit board may be produced by means of the method.

Embodiments of the invention make it possible to remove or hold off a treatment liquid from the material to be treated in an assembly for wet-chemical treatment of a material to be treated. Thus a retaining surface for holding back treatment liquid may be arranged spaced apart from a useful region of the material to be treated, such that a gap is formed in order to reduce or to avoid direct contact of the useful region with a fixed element.

Embodiments of the invention may be used, in particular, in assemblies in which planar material to be treated with a sensitive surface is transported in a horizontal transport plane or substantially in a horizontal transport plane. However, the embodiments are not restricted to this field of application.

The invention is described in more detail hereinafter with reference to preferred or advantageous embodiments and by referring to the accompanying drawings, in which.

Directional or positional information which refers to the material to be treated is provided relative to the transport direction, according to convention. The direction which, when transporting the material to be treated is parallel and/or non-parallel to the transport direction, is denoted as the longitudinal direction which in the direction in the transport plane at right angles to the transport direction is denoted as the width direction of the material to be treated.

Embodiments of devices and methods are disclosed in which treatment liquid is held off or removed from a material to be treated. By "treatment liquid" is understood any liquid to which the material to be treated may be subjected in an assembly for wet-chemical treatment, in particular a process chemical, a rinsing liquid such as water or the like.

The embodiments are disclosed in the context of an assembly for the treatment of material to be treated, in which the material to be treated is transported in a horizontal transport plane. Information such as "above the transport plane" or "below the transport plane", "upper surface", "lower surface", as well as references to height or a level of treatment liquid and the like, accordingly refer to the vertical direction, as long as it is not indicated otherwise. By "transport in a horizontal transport plane", may be understood, in particular, a transport of material to be treated in which at least three corners of the material to be treated are located in a horizontal plane. This does not exclude the fact that at least an individual portion or individual regions of the material to be treated during transport are located outside the transport plane, for example in a material to be treated with low inherent rigidity.

Figure 1:
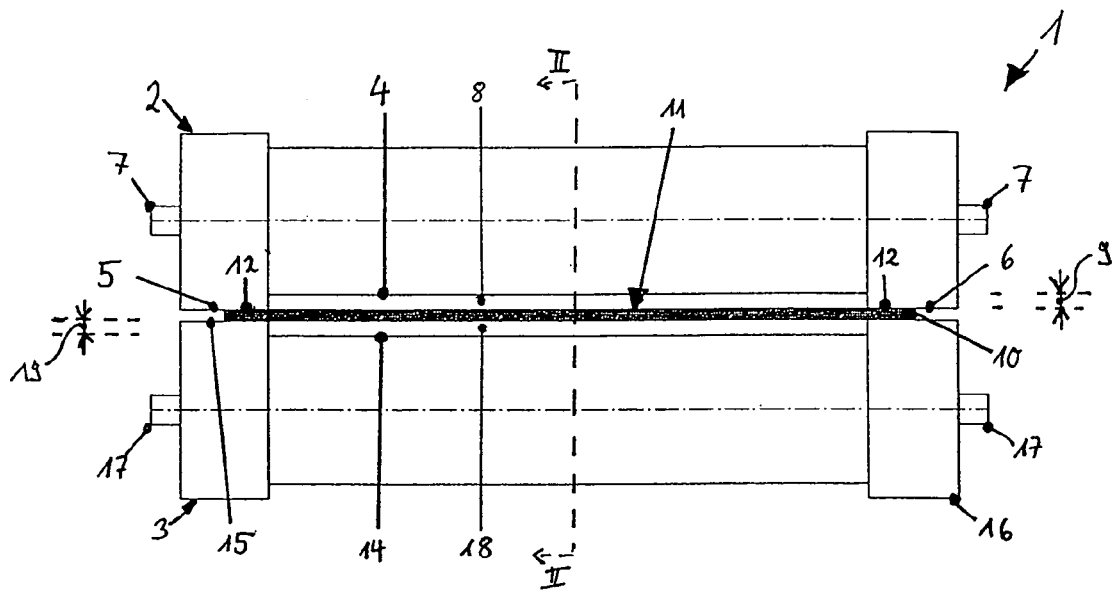
FIG. 1 is a schematic front view of a device for removing or holding off treatment liquid according to an embodiment.
Figure 2:
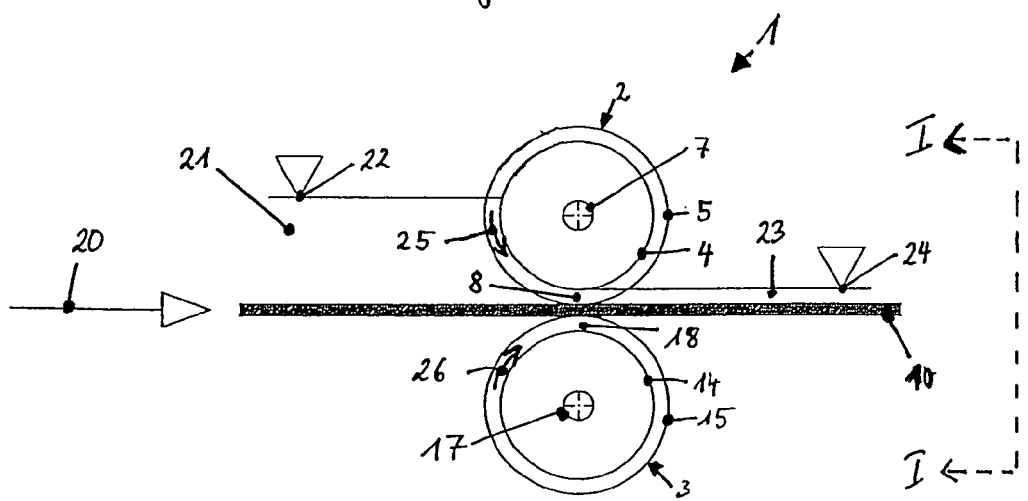
FIG. 2 is a schematic, partially sectional side view of the device of FIG. 1.

FIG. 1 is a schematic front view of a device 1 for removing treatment liquid from a material to be treated 10. FIG. 2 is a schematic side view of the device 1 along the direction denoted in FIG. 1. by II-II. The cutting plane of the partially sectional side view is a vertical plane, which intersects the transport plane along a line on which a useful region of the material to be treated is transported.

Figure 9:
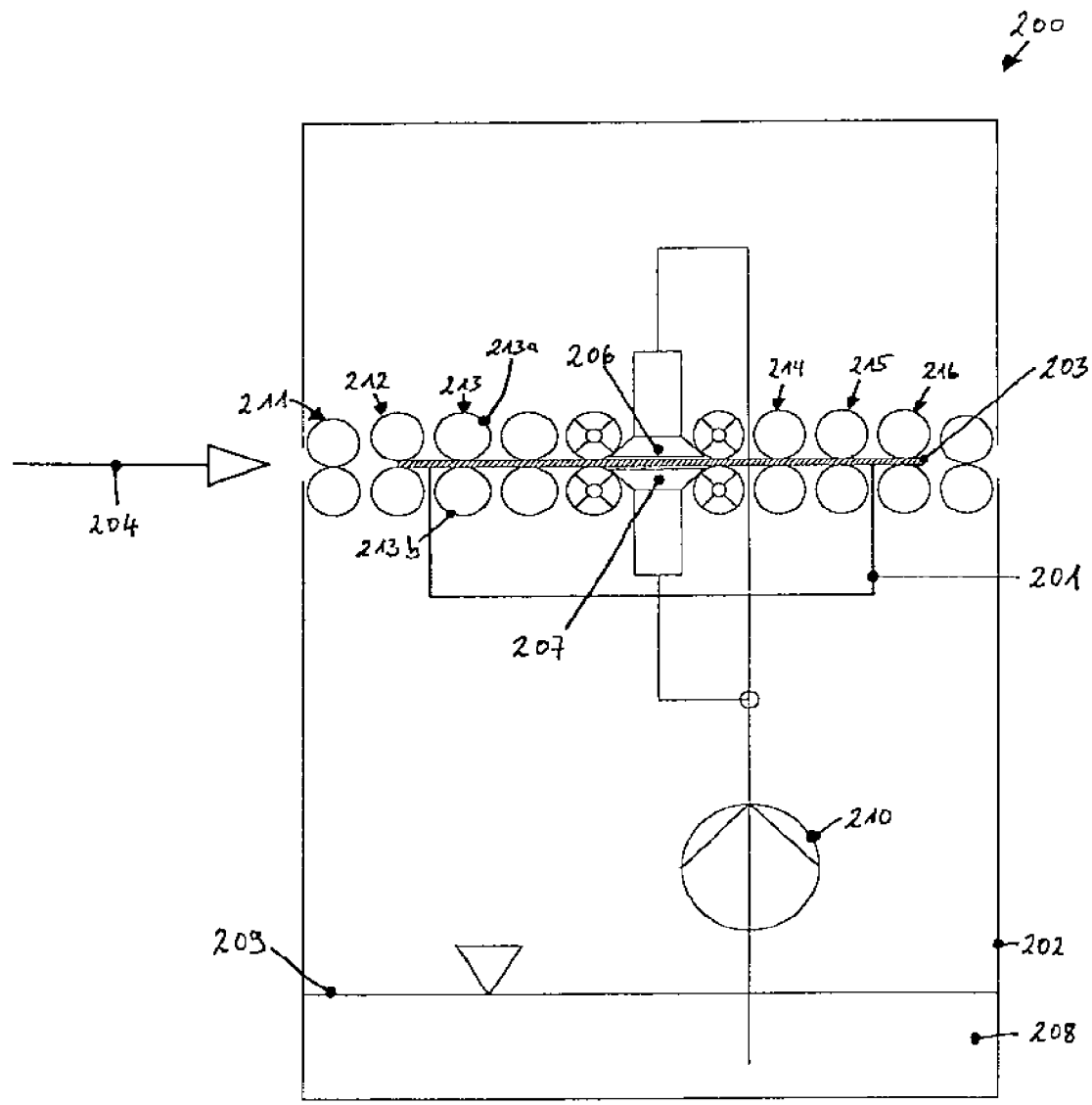
FIG. 9 is a schematic, partially sectional side view of a treatment station with nip roll pairs.

The device 1 comprises a roll 2 and a further roll 3, which are arranged on opposing sides of a transport plane for the material to be treated 10, such that the material to be treated 10 is transported between the roll 2 and the further roll 3. The device 1 may, for example, be used as a pair of nip rolls 213 or 215 in the treatment station 200 of FIG. 9.

The roll 2 has a retaining surface 4 for treatment liquid, which is provided as an offset portion of the peripheral surface of the roll 2. The roll 2 is positioned relative to a transport path of the material to be treated 10, so that a gap 8 remains between the retaining surface 4 and the material to be treated 10, when the material to be treated 10 is transported past the roll 2. The portion forming the retaining surface 4 of the peripheral surface of the roll 2 may be configured substantially cylindrically.

The further roll 3 has a further retaining surface 14 for the treatment liquid which is provided as an offset portion of the peripheral surface of the roll 3. The further roll 3 is positioned relative to the transport path of the material to be treated 10, so that a gap 18 remains between the further retaining surface 14 and the material to be treated 10, when the material to be treated 10 is transported past the roll 3. The portion of the peripheral surface of the roll 3 forming the further retaining surface 14 may be configured substantially cylindrically.

Due to the gaps 8, 18 which are formed by the arrangement and design of the roll 2 and the further roll 3, a useful region 11 of the material to be treated 10 which extends over a large part of the width direction of the material to be treated 10, does not come into contact with fixed elements of the device 1. The risk of damage to the surfaces of the material to be treated 10 in the useful region 11 may be reduced in this manner.

Due to the cylindrical shape of the retaining surface 4 and the further retaining surface 14, the gaps 8, 18 have a gap height and/or clear height which may be altered in the transport direction 20 of the material to be treated 10. A minimum gap height 9, 19 of the gaps 8, 18 is determined by those points of the retaining surfaces 4, 14 which are at the shortest distance from the surface of the material to be treated 10 opposing the respective roll 2 and/or 3.

Even if the gaps 8, 18 permit the passage of treatment liquid, treatment liquid may be removed from the material to be treated 10 by the device 1. In particular, by the tapering of the gaps 8, 18 up to the minimum gap height 9, 19, the device 1 may cause a loss of pressure which may lead to variable liquid levels of the treatment liquid on the two opposing sides of the roll 2 in the transport direction 20.

FIG. 2 shows schematically a treatment liquid 21 which is accumulated on one side of the roll 2 up to a level 22, and a layer of treatment liquid 23 remaining after moving the material to be treated 10 past the device 1, which has a lower level 24. The device 1 may, in particular, be designed so that the treatment liquid 21 is accumulated on one side of the rolls 2, 3 (in FIG. 2 on the left-hand side of the rolls 2, 3) by the retaining surface 4 and the further retaining surface 14 up to a level 22 which, directly on the retaining surface 4, is higher than the minimum gap height 9 of the gap 8 and than the minimum gap height 19 of the gap 18, in each case measured from the lower edge of the corresponding gap 8, 18 at the position with the minimum gap height.

As will be explained in more detail with reference to FIGS. 3-6, the treatment liquid 23 still remaining on the material to be treated after moving the material to be treated 10 past the retaining surfaces 4, 14 may be removed in a suitable manner, for example by causing fluid to flow onto the material to be treated.

The rolls 2, 3 of the device 1 may not only be designed for removing liquid from the material to be treated 10 but also for transporting the material to be treated 10. To this end, on its two axial ends the roll 2 may have raised edge portions 5, 6 which are brought to bear against an edge region 12 of the material to be treated 10, when the material to be treated is moved past the rolls 2, 3. The raised edge portions 5, 6 may be driven in rotation, in order to transport the material to be treated 10. For the rotational drive of the edge portions 5, 6 a shaft 7 is provided which when using the device 1 is rotatably mounted in a treatment assembly for the material to be treated 10. By rotating the edge portions 5, 6 in one rotational direction 25, the material to be treated 10 may be transported further. Accordingly, the roll 3 on its two axial ends may have raised edge portions 15, 16, which are brought to bear against an edge region 12 of the material to be treated 10, when the material to be treated is moved past the rolls 2, 3. The raised edge portions 15, 16 may be driven in rotation in order to transport the material to be treated 10. For the rotational drive of the edge portions 15, 16 a shaft 17 is provided which, when using the device 1, is rotatably mounted in a treatment assembly for the material to be treated 10. By rotating the edge portions 15, 16 in one rotational direction 26, the material to be treated 10 may be transported further.

The edge portions 5, 6 and/or the edge portions 15, 16 may form a frictional connection and/or a positive connection with the material to be treated 10 in order to transport said material to be treated. For example, on the edge portions 5, 6 and/or on the edge portions 15, 16 projections may be formed which engage in corresponding recesses of the material to be treated 10 in order to transport the material to be treated 10.

In the roll 2, the raised edge portions 5, 6 act as transport portions, which may be coupled to the material to be treated 10 for transporting the material to be treated 10. The retaining surface 4 is offset relative to the edge portions 5, 6. The raising and/or the greater radius of the edge portions 5, 6 in comparison with the radius of the retaining surface 4, determines the minimum gap height 9. Accordingly, in the roll 3 the raised edge portions 15, 16 act as transport portions which may be coupled to the material to be treated 10 for transporting the material to be treated 10. The retaining surface 14 is offset relative to the edge portions 15, 16. The raising and/or the greater radius of the edge portions 15, 16 in comparison with the radius of the retaining surface 14 determines the minimum gap height 19.

The radii of the edge portions and the retaining surface may be selected to be suitable for the desired field of application. For example, the radius of the portion of the roll 2, 3 forming the retaining surface may be less than the radius of the edge portions of the roll 2, 3 which are used as transport portions by less than 1 mm, in particular by less than 0.7 mm, in particular by less than 0.5 mm. The radius of the portion of the roll 2, 3 forming the retaining surface may be less than the radius of the edge portions of the roll 2, 3 which are used as transport portions by at least 0.05 mm, in particular by at least 0.07 mm, in particular by at least 0.09 mm.

Additionally, the shaft 7 of the roll 2 and/or the shaft 17 of the further roll 3 may be mounted with a height-adjustable bearing such that a spacing of the shaft 7 from the upper surface of the material to be treated 10 and/or a spacing of the shaft 17 from the lower surface of the material to be treated 10 may be set.

The roll 2 and the further roll 3 may be designed so that when rotating the edge portions 5, 6 and/or 15, 16 serving as transport portions, the retaining surfaces 4 and/or 14 of the respective roll also rotate in the same direction with the transport portions of the respective roll. In this manner, a relative movement between the retaining surfaces 4 and 14 and the surface of the material to be treated 10 may be reduced.

To this end, the roll 2 and/or the roll 3, for example, may be designed so that both the transport portions and the retaining surface are configured on the surface thereof fixedly in terms of rotation relative to one another. Alternatively, however, the transport portions may be provided to be rotatable relative to the retaining surface as will be explained in more detail with reference to FIG. 8.

In one embodiment, the transport portions may be provided to be rotatable relative to the retaining surface. An angular speed of the retaining surface may be selected depending on an angular speed of the transport portions, a radius of the transport portions and a radius of the portion of the roll forming the retaining surface. The angular speed of the retaining surface may be selected so that the circumferential speed on the retaining surface is the same as the transport speed of the material to be treated.

A plurality of modifications of the device 1 may be implemented in further embodiments.

Whilst, for example, the rolls 2, 3 of the device 1 have at their axial ends raised portions 5, 6, 15, 16, more than two raised portions may also be provided on the roll 2 and/or on the further roll 3. The further raised portions may thus, in particular, be arranged on the roll 2 and/or on the further roll 3 so that they come into contact with the material to be treated 10 on surface regions where such a mechanical contact is not critical. For example, surface regions of the material to be treated running in the longitudinal direction of the material to be treated 10 may be supported by further raised portions of the roll 2 and/or of the further roll 3. The useful region 11 of the material to be treated 10 may be defined by those surface regions of the material to be treated which do not come into contact with the raised portions of the roll 2 or the further roll 3. The additional supporting action which is effected by the further raised portions may reduce the risk of undesired contact of the material to be treated 10 in its useful region.

Whilst in the device 1, retaining surfaces 4, 14 which form a gap with a surface of the material to be treated are provided both above and below the transport plane, in a device according to a further embodiment a retaining surface may be provided on one side only, and which forms a gap with a surface of the material to be treated. For example, such a gap-forming retaining surface may be arranged only on the upper side or only on the lower side of the transport plane. On the opposing side, for example, a roll may be provided which has a substantially uniform diameter. The roll may thus come into contact with a surface of the material to be treated in the useful region of the material to be treated. The gap-forming retaining surface provided on the other side may lead to a reduction of the forces exerted on the surfaces of the material to be treated, in order to reduce the risk of damage to the surfaces.

In a further embodiment, a peripheral surface of a roll with a diameter which is constant, i.e. which does not vary in the axial direction of the roll, may also serve as a retaining surface which defines a gap between the retaining surface and the surface of the material to be treated. The design of the gap, in particular the minimum gap height, may be made adjustable, by the roll being mounted by a bearing, which is height-adjustable relative to the transport plane. Also, two such rolls may be provided in order to remove liquid on the upper side and on the lower side of the material to be treated, a gap remaining which is formed between the corresponding roll and the material to be treated.

Figure 3:
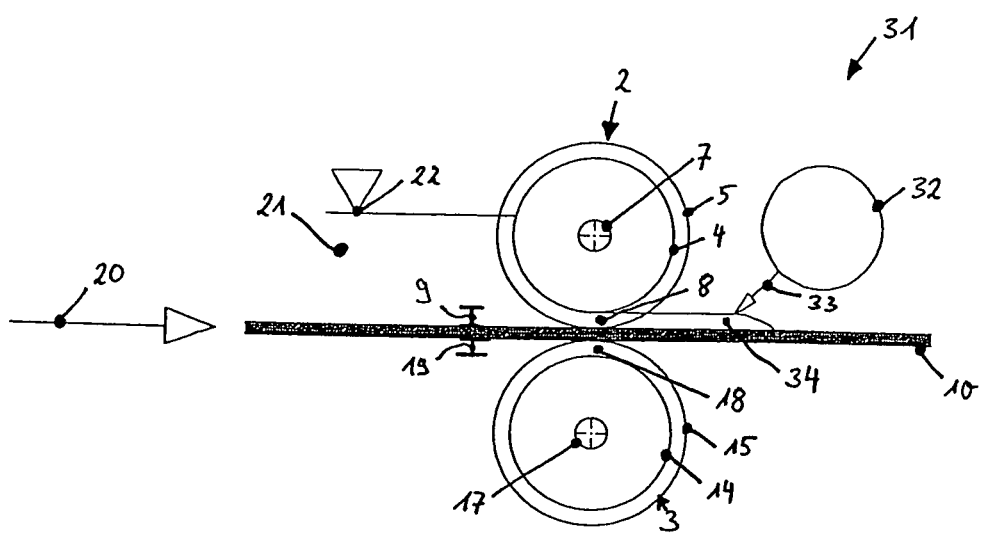
FIG. 3 is a schematic, partially sectional side view of a device for removing treatment liquid according to a further embodiment.

FIG. 3 is a schematic side view of a device 31 for removing treatment liquid according to a further embodiment. The device 31 may be used, for example, in the outflow region of the treatment station 200 of FIG. 9 instead of the pair of nip rolls 214, 215, 216. Elements or equipment of the device 31, which in function and/or design correspond to elements or equipment of the device 1, are provided with the same reference numerals and are not explained again in detail.

The device 31 comprises a retaining surface 4 for holding back liquid. The device 31 is designed so that the retaining surface 4 forms a gap 8 with the surface of a material to be treated 10 opposing it (in FIG. 3 with the upper surface of the material to be treated 10). The retaining surface 4 may, for example, be provided on a rotatably mounted roll 2. The roll 2 may be designed as described below with reference to FIGS. 1 and 2. The retaining surface 4 removes treatment liquid from the material to be treated 10 transported past the retaining surface 4. As the gap 8 in one embodiment permits the passage of treatment liquid, treatment liquid 34 may still be present on the material to be treated 10 after said material to be treated has passed through the roll 2 with the retaining surface 4.

The device 31 further comprises a flow device 32 with a nozzle arrangement. The flow device 32 in the transport direction is spaced apart from the roll 2 and the retaining surface 4 provided on the roll 2. The flow device 32 is arranged downstream in the transport direction, i.e. in the transport direction after the roll 2 with the retaining surface 4. The flow device 32 is designed to remove from the material to be treated 10 a portion of the treatment liquid 34 which remains on the material to be treated 10 after passing through the gap 8. The flow device 32 may, in particular, be designed to remove from the material to be treated 10 a large portion of the treatment liquid 34 which remains on the material to be treated 10 after passing through the gap 8.

The flow device 32 may discharge a fluid flow 33, in particular a gas flow, for example an air flow, in order to blow away the treatment liquid 34 from the material to be treated 10, or to remove the treatment liquid otherwise by the fluid flow 33. The fluid flow 33 may have at least one flow component in the direction of the gap-forming retaining surface 4 of the device 31 (in FIG. 3 a component oriented to the left). On the retaining surface 4, the treatment liquid may flow to the side of the material to be treated.

The flow device may also be designed so that the fluid flow 33 has a flow component which is oriented parallel to the transport plane and transversely to the transport direction 20, i.e. parallel to the axial direction of the roll 2, on which the retaining surface 4 is formed. In this manner, the treatment liquid 34 may be removed from the material to be treated 10 to the side.

The flow device 32 may extend over the entire width of the material to be treated 10, i.e. over the extension of the material to be treated 10 transversely to the transport direction, over the material to be treated 10. For the discharge of the fluid flow 33, the flow device 32 may comprise one or more nozzle openings. The nozzle openings may, for example, be formed as a continuous slot, a plurality of slots or a plurality of bores, which are formed in the width direction of the material to be treated 10 on the flow device 32. The flow device 32 may be designed so that the spacing of the nozzle openings relative to the surface of the material to be treated 10 is substantially the same size over the entire width of the material to be treated.

The flow device 32 may comprise a straight channel body, which is oriented parallel to the transport plane and transversely to the transport direction 20. The channel body may alternatively be oriented parallel to the transport plane and obliquely to the transport direction 20.

In one embodiment, the shape of the flow device 32 may be such that a central portion of the flow device 32 in the width direction of the material to be treated is arranged closer to the gap-forming retaining surface 4 than an edge portion of the flow device 32. For example, the flow device 32 may have a shape which in a plan view from a direction perpendicular to the transport plane (i.e. in FIG. 3 when viewed perpendicular from above onto the transport plane) has a convex shape towards the gap 8 formed by the retaining surface 4. For example, the flow device 32 in plan view may have a V-shape, the points thereof pointing towards the retaining surface 4. A flow device thus configured is designed to discharge the fluid flow with a speed component in the direction of one edge of the material to be treated, in order to convey effectively the treatment liquid towards the edge of the material to be treated and thus to remove said treatment liquid.

The flow device 32 may be designed to discharge a gas flow, in particular an air flow, which thus flows onto the material to be treated. The flow device 32 may be designed so that an outflow speed of the gas flow 33 is at least 2 m/sec, in particular at least 10 m/sec, in particular at least 30 m/sec.

The flow device 32 may also be designed to discharge a liquid flow and thus to flow onto the material to be treated. The flow device 32 may be designed so that an outflow speed of the liquid flow 33 is at least 0.1 m/sec, in particular at least 1 m/sec, in particular at least 3 m/sec.

The flow device 32 may be designed so that an outflow direction of the fluid flow 33 may be parallel or oblique to the surface of the material to be treated. In particular, the flow device 32 may be configured so that the fluid flow flows out from the nozzle openings of the flow device 32 in the direction of the gap 8 and/or transversely to the transport direction, towards one edge of the material to be treated 10. Alternatively, the outflow direction may also be directed perpendicular to the surface of the material to be treated 10.

The flow device 32 may be configured so that the fluid flow 33 does not pass through the gap 8, i.e. does not enter the treatment liquid accumulated on the opposing side of the gap-forming retaining surface 4. In this manner, it may be avoided or prevented that the fluid flow 33 causes the formation of bubbles in the treatment liquid 21. In order to avoid the passage of the fluid flow 33 through the gap 8, for example a volume flow or one or more of a volume flow, the outflow speed, and/or the outflow direction of the fluid flow 33 from the flow device 32 may be accordingly set.

The device 31 may be designed so that a spacing or the different spacings between the gap 8 and the nozzle opening and/or the nozzle openings of the flow device 32 are at most 100 mm and at least 10 mm.

As shown in FIG. 3, the device 31 may also comprise a further retaining surface 14 arranged below the transport plane, which may be formed on a further roll 3.

A plurality of modifications of the device 31 may be implemented in further embodiments. Whilst, for example, with reference to FIG. 3 a device 31 for removing treatment liquid has been described, in which the flow device 32 is arranged downstream of the roll 2 with the gap-forming retaining surface 4 in the transport direction of the material to be treated 10, a device for holding off treatment liquid may also be designed so that the flow device in the transport direction of the material to be treated is arranged in front of and/or upstream of the gap-forming retaining surface. A device thus formed may, in particular, be used in an inflow region of a treatment station.

In a device for removing or holding off treatment liquid according to a further embodiment, the flow device 32 may alternatively or additionally be provided below the transport plane, in order to blow away liquid from an underside of the material to be treated 10 or otherwise to remove liquid from the material to be treated 10 by means of the fluid flow 33 discharged from the flow device.

If the flow device is provided below the transport plane, it may be designed so that the fluid flow produced by the flow device has a speed component parallel to the transport direction which is directed away from the gap-forming retaining surface. For example, in a flow device provided in an outflow region of a treatment station, the fluid flow produced by the flow device may have a speed component oriented in the transport direction.

If a flow device for removing treatment liquid is provided above the transport plane, a transport element may be provided at the corresponding position below the transport plane. In a similar manner, if a flow device for removing treatment liquid is provided below the transport plane, a transport element may be provided at the corresponding position above the transport plane. The transport element and the flow device may be arranged at the same position in the transport direction on opposing sides of the transport plane.

The transport element may, for example, be designed to support and/or transport the material to be treated. The transport element may be configured as a roll. The roll may have an offset retaining surface but may also have a substantially constant diameter in the axial direction. The transport element may also be formed as a wheel axle, on which a plurality of wheels are provided. The wheels may be designed in order to come into contact with the material to be treated for transporting the material to be treated.

Figure 4:
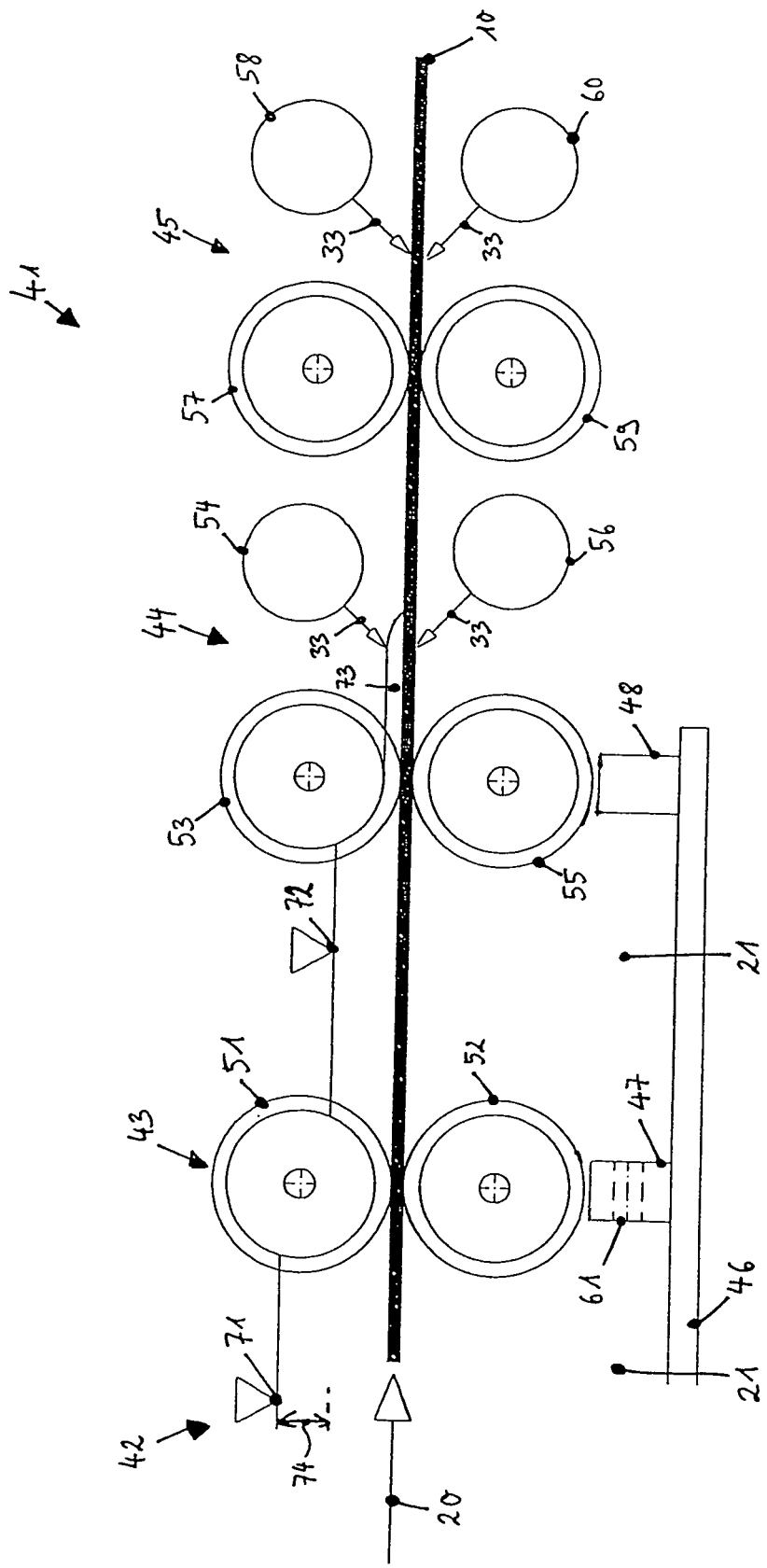
FIG. 4 is a schematic, partially sectional side view of a portion of a treatment station with a plurality of devices for removing treatment liquid according to one embodiment.

FIG. 4 is a schematic side view of an outflow region 41 of a treatment station. Such an outflow region 41 may be provided in the treatment station 200 of FIG. 9 at one end of the inner container 201, at which the material to be treated leaves the treatment station. In the outflow region a material to be treated 10 is transported further in a transport direction 20 from a treatment region 42 in which a treatment liquid 21 is accumulated sufficiently high for the material to be treated to be immersed.

The outflow region 41 comprises a plurality of devices 43, 44 and 45 for removing treatment liquid from the material to be treated 10. The devices 43, 44 and 45 for removing treatment liquid are spaced apart from one another in the transport direction 20, arranged along a transport path of the material to be treated 10. Each of the devices 43, 44 and 45 may have a retaining surface which is arranged relative to the transport plane, so that a gap is formed between the retaining surface and the surface of the material to be treated 10 opposing it.

The devices 43, 44 and 45 may be formed as devices for removing treatment liquid according to one embodiment. In one embodiment, the device 43 may comprise a pair of rolls 51, 52 which are arranged so that the material to be treated 10 may be passed therebetween. On at least one of the rolls 51, 52 of the device 43, a gap-forming retaining surface may be formed for holding back the treatment liquid so that a gap is formed between the retaining surface and the surface of the material to be treated 10 opposing said retaining surface, when the material to be treated is moved past the rolls 51, 52. In particular, at least one of the rolls 51, 52 may have raised edge regions for transporting the material to be treated 10 and an offset retaining surface provided therebetween. The device 43 may, for example, be configured in the manner of the device 1 described with reference to FIGS. 1 and 2.

The device 44 may have a roll 53 arranged above the transport plane and a flow device 54 and a roll 55 arranged below the transport plane and a flow device 56. On at least one of the rolls 53, 55 of the device 44, a gap-forming retaining surface may be formed for holding back the treatment liquid so that a gap is formed between the retaining surface and the surface of the material to be treated 10 opposing said retaining surface, when the material to be treated is moved past the rolls 53, 55. In particular, at least one of the rolls 53, 55 may have raised edge regions for transporting the material to be treated 10 and an offset retaining surface provided therebetween, as explained with reference to FIGS. 1 and 2. The flow devices 54 and 56 cause a fluid flow 33 to flow onto the material to be treated 10, for example an air flow, in order to remove treatment liquid remaining on the material to be treated. To this end, the fluid flows 33 discharged by the flow devices 54 and 56 may be directed so that they move and thus remove the treatment liquid in the direction of one edge of the material to be treated.

The device 45 may have a roll 57 arranged above the transport plane and a flow device 58 and a roll 59 arranged below the transport plane and a flow device 60. On at least one of the rolls 57, 59 of the device 45, a gap-forming retaining surface for holding back the treatment liquid may be formed so that a gap is formed between the retaining surface and the surface of the material to be treated 10 opposing said retaining surface, when the material to be treated is moved past the rolls 57, 59. In particular, at least one of the rolls 57, 59 may have raised edge regions for transporting the material to be treated 10 and an offset retaining surface provided therebetween, as explained with reference to FIGS. 1 and 2. The flow devices 58 and 60 cause a fluid flow 33 to flow onto the material to be treated 10, for example an air flow, in order to remove treatment liquid remaining on the material to be treated. To this end, the fluid flows 33 discharged from the flow devices 58 and 60 may be directed so that they move and thus remove the treatment liquid in the direction of one edge of the material to be treated.

The gap-forming retaining surfaces of the devices 43, 44 and 45 which the material to be treated 10 passes through in succession, may be of different designs. For example, the gaps on the devices may become increasingly narrow. For example, the device 43 may be designed so that a gap is formed with a first minimum gap height between the retaining surface of the device 43 and the opposing surface of the material to be treated 10, whilst the device 44 arranged downstream of the device 43 in the transport direction may be designed so that a gap is formed with a second minimum gap height between the retaining surface of the device 44 and the opposing surface of the material to be treated 10. Thus, the second minimum gap height on the device 44 may be less than the first minimum gap height on the device 43, i.e. the gaps in the outflow region of the treatment station from one device to a further device for removing treatment liquid arranged downstream in the transport direction may have a lower height.

The device 43, which defines the treatment region 42, is designed so that a difference in levels 74 of the treatment liquid is set between the sides of the roll 51 which oppose one another in the transport direction. In the treatment region 42, the treatment liquid 21 is accumulated up to a level 71, whilst in the adjacent region on the other side of the roll 51, the treatment liquid is accumulated up to a level 72.

The device 44, which is arranged downstream of the device 43 in the transport direction, is designed so that the treatment liquid is removed from the material to be treated 10, when the material to be treated 10 passes through the rolls 53, 55. Treatment liquid 73 which is still present on the material to be treated 10 after moving the material to be treated past the rolls 53, 55, is at least partially removed by the flow devices 54, 56. By the device 45 which is arranged downstream of the device 44 in the transport direction, a further portion of the treatment liquid may be removed from the material to be treated, which after passing through the device 44 may still be present on the material to be treated 10.

By the use of a plurality of devices for removing treatment liquid, treatment liquid may be reliably removed from the material to be treated 10, even when gaps remain between the retaining surfaces and the material to be treated 10.

Between a base 46 of an inner container of the treatment station and the roll 52 of the device 43 arranged below the transport plane, a barrier 47 is provided. By means of the barrier 47, a difference in levels 74 between the liquid levels 71, 72 may be set on both sides of the device 43. To this end, openings 61, for example in the form of elongate holes, bores or slots are formed in the barrier 47. The openings 61 may be able to be closed, in order to adjust the flow of liquid through the barrier 47, and thus adjust the difference in levels 74 between the liquid levels 71 and 72.

The level 72 in the region adjacent to the treatment region 42 is determined by balancing the flows of treatment liquid flowing in and out. In order to be able to adjust said flows and thus the level 72, between the barriers 47, 48 one or more openings, for example closable bores, may be provided in the base 46. By a suitable choice of the openings which are open in the barrier 47, and the openings which are open in the base 46, a basic setting for a desired level 72 in the region adjacent to the treatment region 42 may be selected. Additionally, overflow barriers may be provided on elements which laterally define the treatment station, for example on bearing receivers which are provided for bearing the rolls 51, 52, 53 and 55. Quantities of liquid additionally flowing-in may be discharged via the overflow barriers.

In order to balance the flow of treatment liquid flowing out of the treatment region 42, treatment liquid may be conveyed by a pump (not shown) into the treatment region 42.

Between the base 46 of the inner container of the treatment station and the roll 55 of the device 44 arranged below the transport plane, a barrier 48 is provided. The barrier 48 does not have to have any closeable openings for adjusting the liquid level. The barrier 48 assists with reducing the flow of treatment liquid away from the treatment region.

In further embodiments, modifications to the outflow region 41 may be implemented. In one embodiment, for example, the device 45 may be omitted. Accordingly, two devices for removing treatment liquid may be provided in the outflow region. At least the last of these devices in the transport direction may have a flow device. The flow device may be provided at least above the transport plane.

In a further embodiment, a plurality of devices for removing liquid may be provided which have a barrier with an opening or a plurality of openings for setting a difference in levels. The barrier may in each case have a design as has been explained with reference to the barrier 47. In one embodiment, for example in the inflow or outflow region, two devices may be provided with in each case at least one roll which has a retaining surface for holding back liquid, which forms a gap with the material to be treated guided past said retaining surface, in each of the devices below the transport plane a barrier being provided with an opening or a plurality of openings, as has been described for the barrier 47. In the transport direction spaced apart from both these devices, a further device may be provided which has a design corresponding to the device 44. In this manner, for example, in an inflow and outflow region at least two regions may be formed with a level of treatment liquid which is lower relative to the treatment region.

Whilst in the devices 43-45 for removing liquid in each case a roll is provided both above and below the transport plane, which forms a gap with the material to be treated guided past said roll, in a further embodiment each of the devices for removing liquid may be configured such that a retaining surface is provided only on the roll provided above the transport plane, which leaves a gap between the retaining surface and the material to be treated guided past said roll. The rolls provided below the transport plane may have a uniform diameter in the axial direction of the rolls.

In one embodiment, one of the flow devices 54, 56 may be replaced by a transport element. The transport element may be designed in order to support and/or transport material to be treated. The transport element may, for example, be configured as a roll or wheel axle. Alternatively or additionally, one of the flow devices 58, 60 may be replaced by a transport element. The transport element may be designed in order to support and/or to transport the material to be treated. The transport element may, for example, be configured as a roll or as a wheel axle.

In one embodiment, one of the flow devices 56, 60 provided below the transport plane may be configured so that the fluid flow 33 produced by the flow device 56, 60 has a speed component which faces in the outflow region 41 in the transport direction.

Figure 5:
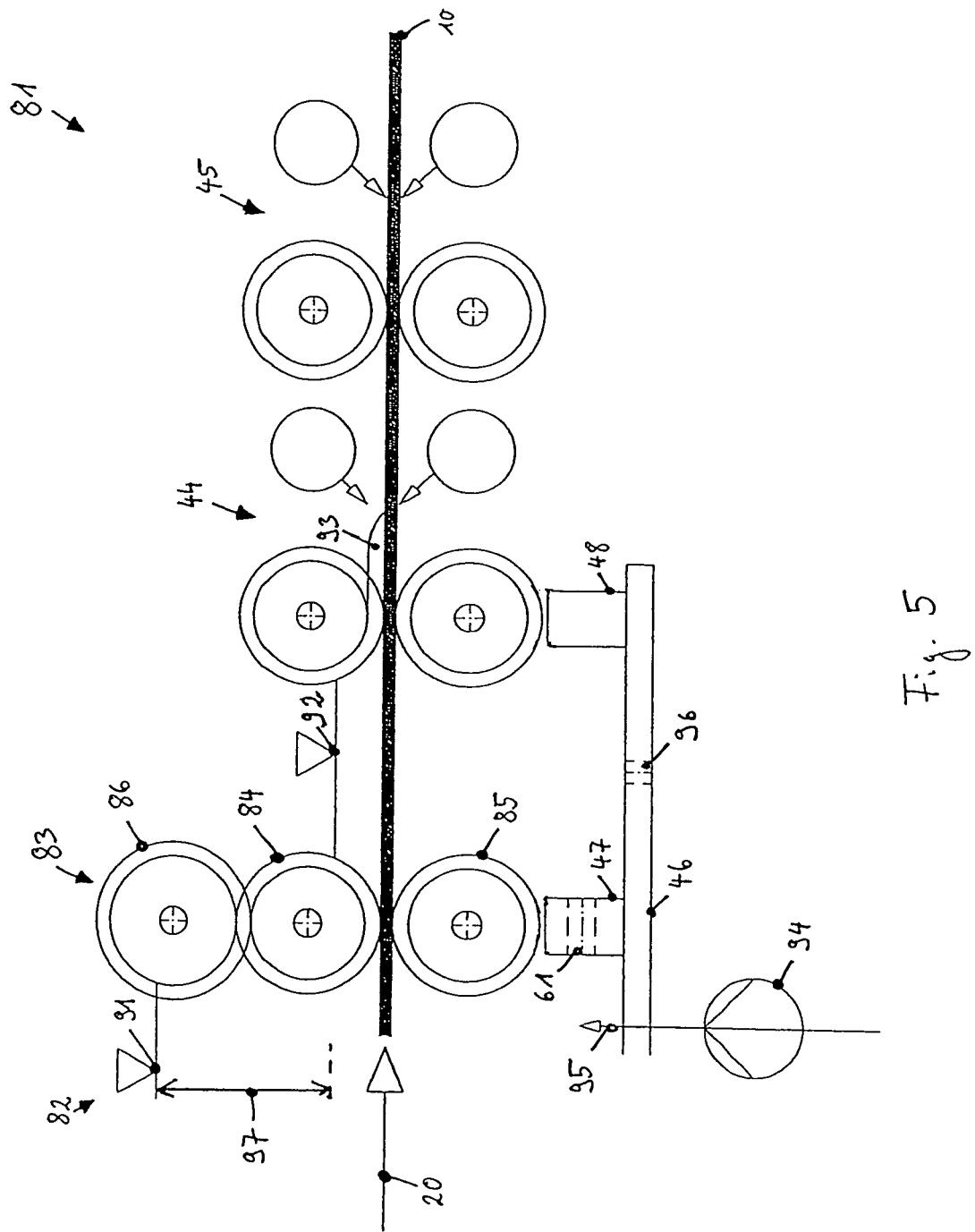
FIG. 5 is a schematic, partially sectional side view of a portion of a treatment station with a plurality of devices for removing treatment liquid according to a further embodiment.

FIG. 5 is a schematic side view of an outflow region 81 of a treatment station. Such an outflow region 81 may be provided in the treatment station 200 of FIG. 9 at one end of the inner container 201 at which the material to be treated leaves the inner container 201. In the outflow region a material to be treated 10 is transported further in a transport direction 20 from a treatment region 82, in which a treatment liquid 21 is accumulated to such a high level that the material to be treated is immersed. Elements or devices of the outflow region 81 which in their function and/or design correspond to elements or devices of the outflow region 41, are provided with the same reference numerals and are not explained in detail again.

In specific treatment stations it may be desirable in the treatment region 82 to set a relatively high liquid level 91. The liquid level 91 in the treatment region 82 may, for example, be arranged at least 15 mm above the transport plane.

The outflow region 81 is provided with a plurality of devices 83, 44 and 45 for removing or holding off treatment liquid. The device 83 comprises rolls 84, 85 which are arranged so that the material to be treated 10 may be passed therebetween. On at least one of the rolls 84, 85 of the device 83, a gap-forming retaining surface may be formed for holding back the treatment liquid so that a gap is formed between the retaining surface and the surface of the material to be treated 10 opposing said retaining surface, when the material to be treated is moved past the rolls 84, 85. In particular, at least one of the rolls 84, 85 may have raised edge regions for transporting the material to be treated 10 and an offset retaining surface provided therebetween. The pair of rolls 84, 85 may, for example, be configured as the device 1 explained with reference to FIGS. 1 and 2.

In order to permit an accumulation of treatment liquid up to a high level 91, the device 83 has a further retaining element 86 above the roll 84. The further retaining element 86 is designed to contribute, with a high liquid level in the treatment region 82, to the accumulation of the treatment liquid, by it acting as a wall for the accumulated liquid. The further retaining element 86 may, for example, be configured as a roll which is configured in a complementary manner to the roll 84, so that the rolls 84, 86 are tightly closed and only permit a small passage of liquid or do not permit any passage of liquid between the rolls 84, 86. Other embodiments of the further element 86 are possible, for example in the form of an upstand.

The device 83 is designed so that a difference in levels 97 of the treatment liquid between the level 91 in the treatment region 82 and a level 92 in the region adjacent thereto on the other side of the device 83 is set and maintained via the device 83. The device 44 arranged downstream of the device 83 in the transport direction, removes further treatment liquid from the material to be treated 10 when this material to be treated passes through the device 44. Instead of the level 92, only a smaller amount of treatment liquid 93 is found on the material to be treated 10, when the material to be treated 10 has passed through the roll pair of the device 44. The device 45 arranged downstream of the device 44 in the transport direction may remove even more treatment liquid from the material to be treated 10 provided this is still required after passing through the device 44.

In order to set the difference in levels 97, closable openings 61 are provided in the barrier 47. The level 92 in the region adjacent to the treatment region 82 is determined by balancing the flows of treatment liquid flowing in and out. In order to be able to set these flows and thus the level 92, one or more openings 96, for example closeable bores, may be provided in the base 46 between the barriers 47, 48. By a suitable choice of openings 61 which are open in the barrier 47, and the openings 96 which are open in the base 46, a basic setting for a desired level 92 in the region adjacent to the treatment region 82 may be selected. Additionally, overflow barriers may be provided on elements which laterally define the treatment station, for example on bearing receivers, which are provided for bearing the rolls of the devices 83 and 44. Quantities of liquid additionally flowing-in may be discharged via the overflow barriers.

In order to balance the flow of treatment liquid flowing out of the treatment region 82, a flow 95 of treatment liquid is conveyed by a pump 94 into the treatment region 82.

Whilst with reference to FIGS. 4 and 5 embodiments of outflow regions of a treatment station have been described, devices for removing or holding off treatment liquid may accordingly also be provided in an inflow region of a treatment station. In particular, in the inflow region a plurality of devices may also be provided spaced apart from one another in the transport direction for removing or holding off treatment liquid, in order to prevent the treatment liquid from flowing onto the material to be treated, before said material to be treated is fed in the inflow region into the treatment station.

The design of the gap-forming retaining surface may be selected in an appropriate manner depending on the specific fields of application.

Figure 6:
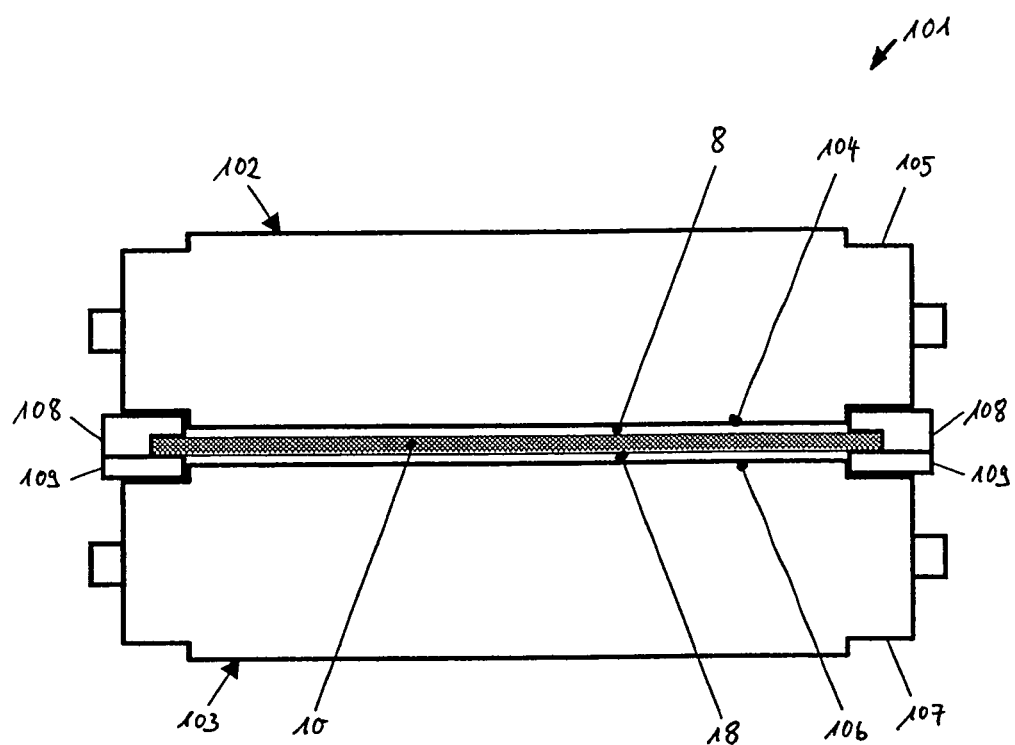
FIG. 6 is a schematic, front view of a device for removing or holding off treatment liquid according to a further embodiment.

FIG. 6 is a schematic front view of a device 101 for removing or holding off treatment liquid according to a further embodiment.

The device 101 comprises a roll 102 and a further roll 103. The roll 102 and the further roll 103 are arranged so that a material to be treated 10 may be transported between the rolls 102 and 103. A peripheral surface of the roll 102 has a retaining surface 104 which is configured for holding back the treatment liquid. The roll 102 with the retaining surface 104 is configured so that a gap 8 remains between the retaining surface 104 of the roll 102 and a surface of the material to be treated 10 opposing said retaining surface, when the material to be treated 10 is moved past the roll 102. Axial end portions 105 of the roll 102 are configured with a smaller diameter than the central portion of the roll 102 defining the retaining surface 104, in order to act as transport portions for transporting the material to be treated 10 if said material to be treated is held on its longitudinal edges by retaining rails.

A peripheral surface of the further roll 103 has a further retaining surface 106 which is configured for holding back the treatment liquid. The further roll 103 with the further retaining surface 106 is designed so that a gap 18 remains between the further retaining surface 106 of the further roll 103, and a surface of the material to be treated 10 opposing this roll, when the material to be treated 10 is moved past the further roll 103. Axial end portions 107 of the further roll 103 are configured with a smaller diameter than the central portion of the further roll 103 defining the further retaining surface 106, in order to act as transport portions for transporting the material to be treated 10, if said material to be treated is held on its longitudinal edges by retaining rails.

On the longitudinal edges of the material to be treated 10, retaining rails 108, 109 are provided which hold the material to be treated for transporting the material to be treated 10. Such retaining rails 108, 109 may, in particular, be used for transporting material to be treated with low inherent rigidity, in order to lend additional stability to the material to be treated. The roll 102 and further roll 103 of the device 101 are designed so that their axial end portions 105, 107 with a smaller diameter come to bear against the retaining rails 108, 109. By rotating the roll 102 and the further roll 103, the material to be treated 10 may be transported further via the retaining rails 108, 109.

In the device 101, the retaining surfaces 104, 106 of the rolls 102, 103 are offset relative to the transport portion provided on the axial end of the rolls 102, 103, so that gaps 8, 18 are formed with the desired minimum gap height between the retaining surfaces 104, 106 and the surfaces of the material to be treated 10 opposing said retaining surfaces, when the material to be treated 10 is moved past the retaining surfaces 104, 106.

In the device 101, the rolls 102, 103 do not directly come into contact with the material to be treated 10. The transport of the material to be treated 10 takes place via a coupling of the transport portions 105, 107 with the retaining rails 108, 109 on which the material to be treated 10 is held.

In a modification of the device 101, the rolls 102, 103 may be configured so that they come into contact with the material to be treated 10 in an edge region adjacent to the retaining rails 108, 109, in order to transport said material to be treated. To this end, on the rolls 102, 103 raised transport portions may be provided which come into contact with the material to be treated adjacent to the retaining rails 108, 109. The rolls 102, 103 may further be designed so that between the rolls 102, 103 and the retaining rails 108, 109 a gap for displacing liquid is also formed. To this end, correspondingly set-back recesses or grooves relative to the transport portions of the rolls for squeezing liquid from the retaining rails may be provided on the rolls 102, 103. The gap formed between the rolls and the retaining rails may have a minimum gap height which may be less than 1 mm, in particular less than 0.7 mm, in particular less than 0.5 mm. The gap formed between the rolls and the retaining rails may have a minimum gap height which may be at least 0.05 mm, in particular at least 0.07 mm, in particular at least 0.09 mm.

The device 101 for squeezing liquid from the retained material to be treated may also comprise a flow device. The flow device may be configured as explained with reference to FIG. 3. The flow device may be designed, in particular, so that the fluid flow discharged from the flow device also removes treatment liquid from the retaining rails.

In the retaining rails 108, 109, through-holes may be provided which permit the passage of liquid through the retaining rails transversely to the transport direction.

The rolls 102, 103 may be designed in order to exert a force on retaining rails 108, 109 provided on at least one of the longitudinal edges, with a force component which is in the transport plane and is oriented transversely to the transport direction. The force may be oriented so that the retaining rails 108, 109 provided on the opposing longitudinal edges may be forced apart in order to clamp the material to be treated 10 transversely to the transport direction. To this end, for example, the retaining rail(s) 108 and/or 109 on at least one longitudinal edge of the material to be treated may have one or more magnets, in particular permanent magnets. The roll 102 provided above the transport plane and/or the roll 103 provided below the transport plane may have a magnet or a plurality of magnets, in order to exert electromagnetic force on the retaining rail. The force may be oriented so that the retaining rails are forced apart in a resilient manner on the opposing longitudinal edges of the material to be treated 10.

Figure 7:
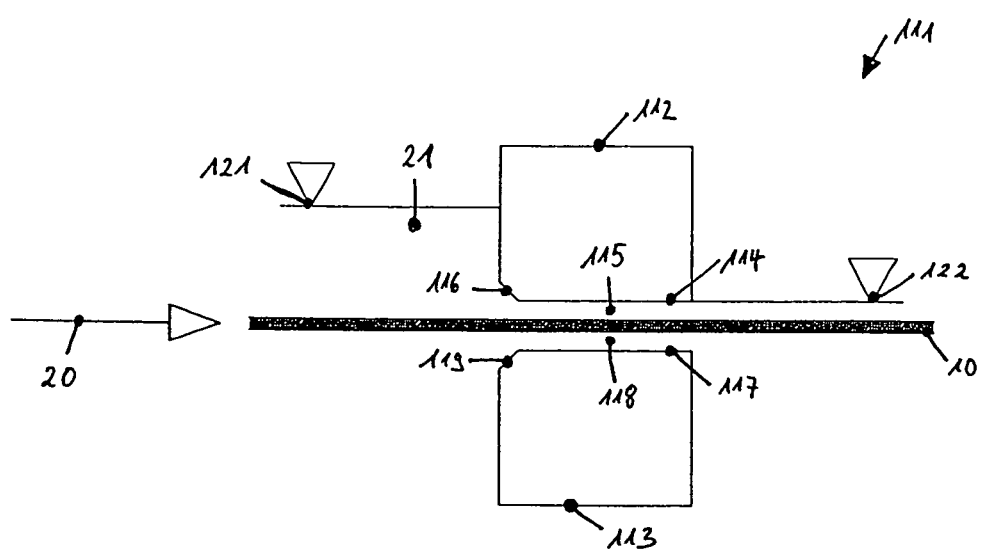
FIG. 7 is a schematic, partially sectional side view of a device for removing treatment liquid according to a further embodiment.

FIG. 7 is a schematic side view of a device 111 for removing or holding off treatment liquid according to a further embodiment. In the device 111 the retaining surfaces are not provided on a rotatably mounted roll.

The device 111 comprises two substantially cuboidal elements 112, 113 which may be used as inserts in an assembly for treating a material to be treated 10. The insert 112 is arranged above the transport plane, and the insert 113 is arranged below the transport plane. A surface of the inserts 112, 113 serves as a retaining surface which holds back treatment liquid.

The inserts 112, 113 of the device 111 are arranged relative to a transport path of the material to be treated 10, so that between an upper surface of the material to be treated 10 and a side surface 114 of the insert 112 facing said upper surface, a gap 115 remains if the material to be treated 10 is guided past the device 111, and in that a gap 118 remains between the lower surface of the material to be treated 10 and a side surface 117 of the insert 113 facing said lower surface, when the material to be treated 10 is guided past the device 111. The side surface 114 of the insert 112 and the side surface 117 of the insert 117 may have a planar design, so that the gaps 115 and 118 extend in the transport direction with a uniform gap height.

The inserts 112, 113 of the device 111 have an inflow region opening counter to the transport direction 20, which is formed by chamfers 116, 119 on the inserts 112, 113. Such an inflow region may, for example, be used for guiding material to be treated with low inherent rigidity, for example films.

The device 111 comprising the inserts 112, 113 may be used for accumulating the treatment liquid 21 in an assembly for wet-chemical treatment of the material to be treated 10. If the material to be treated 10 is guided past the inserts 112, 113 from a treatment region arranged on a first side (left in FIG. 7) of the inserts, in which the treatment liquid 21 is accumulated up to a level 121, a layer of treatment liquid of a smaller depth 122 remains on the material to be treated 10.

The inserts 112, 113 may be configured in a suitable manner according to the structural conditions of the assembly in which the device 111 is used. For example, the inserts 112, 113 may be designed so that the gaps 115, 118 in the transport direction 20 are as long as possible.

The inserts 112, 113 may be mounted fixedly in terms of rotation in the assembly for wet-chemical treatment. The inserts 112, 113 in the assembly, in particular, may also be attached at a position which is fixed in the transport direction. The inserts 112, 113 may be attached so that they are movable vertically relative to one another.

In a modification of the device 111, a cuboidal insert is provided above the transport plane whilst below the transport plane a roll is provided for transporting the material to be treated. The cuboidal insert may, for example, have the same design as the insert 112 of the device 111.

Figure 8:
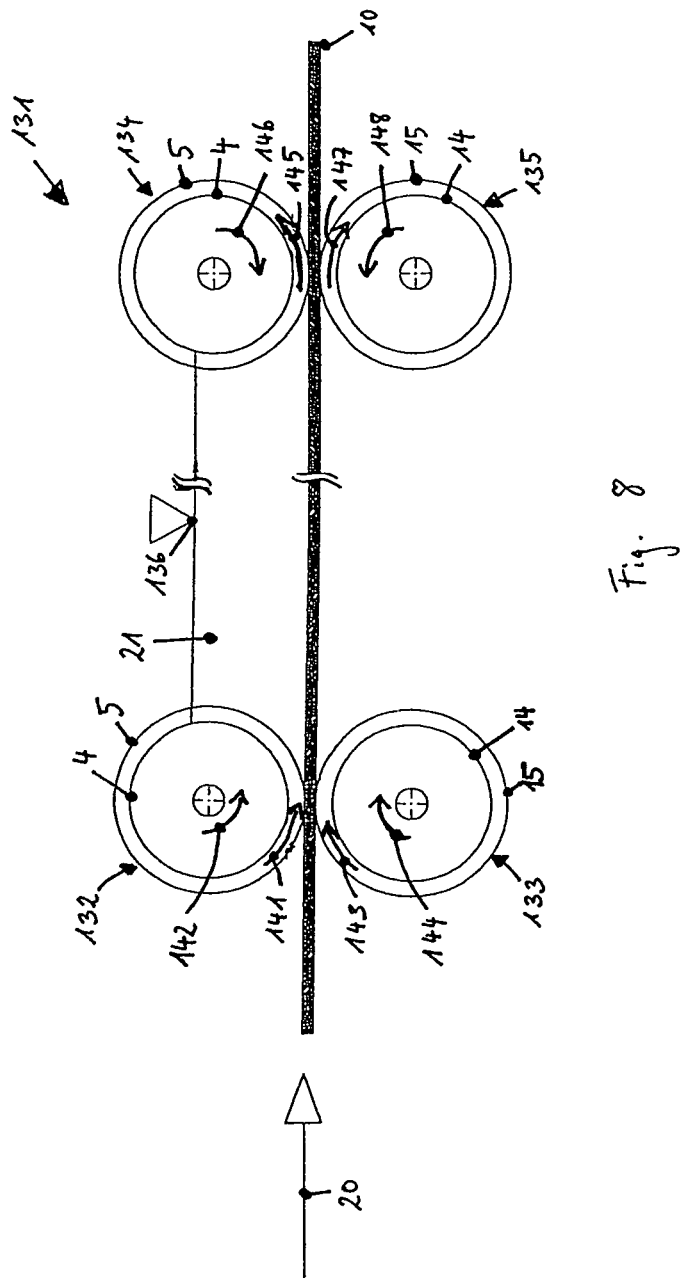
FIG. 8 is a schematic, partially sectional side view of a treatment station with devices for removing or holding off treatment liquid according to an embodiment in an inflow and outflow region.

FIG. 8 is a schematic side view of a treatment station 131 in which in an inflow region a pair of rolls 132, 133 is provided and in an outflow region a further pair of rolls 134, 135 is provided. The roll 132 in the inflow region is arranged above the transport plane and the roll 133 in the inflow region is arranged below the transport plane of a material to be treated 10. The roll 134 in the outflow region is arranged above the transport plane and the roll 135 in the outflow region is arranged below the transport plane of a material to be treated 10. By means of the roll pairs, the treatment liquid 21 in the treatment station 131 is accumulated up to a level 136.

Each of the rolls 132-135 has at its axial ends transport portions in the form of raised portions 5, 15, for transporting the material to be treated. Between the transport portions provided on the ends, a retaining surface 4, 14 with a smaller diameter is formed. As explained with reference to FIGS. 1 and 2, the retaining surface 4, 14 of the rolls forms a gap with the material to be treated guided past the rolls, which extends in the width direction of the material to be treated.

The different portions of the roll 132 in the inflow region are driven rotatably so that the transport portions 5 and the retaining surface 4 arranged therebetween of the roll 132 provided above the transport plane rotate in the same direction. The different portions of the roll 133 in the inflow region are driven rotatably so that the transport portions 15 and the retaining surface 14 arranged therebetween of the roll 133 provided below the transport plane, rotate in the same direction. The rotational direction 141 of the transport portions 5 of the roll 132 provided above the transport plane, is selected so that the transport portions 5 at their points of contact with the material to be treated 10 move in the transport direction 20 in order to transport the material to be treated 10 in the transport direction 20. The rotational direction 143 of the transport portions 15 of the roll 133 provided below the transport plane, is selected so that the transport portions 15 at their points of contact with the material to be treated 10 move in the transport direction 20, in order to transport the material to be treated 10 in the transport direction 20. The retaining surface 4 of the roll 132 provided above the transport plane is rotated in the same direction with the transport portions 5 of the roll 132 in a rotational direction 142, so that the portion of the retaining surface 4 which faces straight towards the material to be treated 10, moves in the direction of the higher liquid level (to the right in FIG. 8). Similarly, the retaining surface 14 of the roll 133 provided below the transport plane is rotated in the same direction with the transport portions 15 in a rotational direction 144, so that the portion of the retaining surface 14 which faces straight towards the material to be treated 10, moves in the direction of the higher liquid level (to the right in FIG. 8).

By a suitable design of the rolls 132, 133, a sufficiently high liquid level 136 may be accumulated whilst the movement of the retaining surfaces 4 towards the region with the high liquid level sufficiently reduces the passage of liquid through the gaps formed on the retaining surfaces 4 of the rolls 132, 133. To this end, the rolls 132, 133 may be designed so that a gap is formed with a minimum gap height of less than 0.3 mm, for example ca. 0.1 mm between the retaining surface 4, 14 and the surface of the material to be treated 10 opposing the retaining surface. For example, the transport portions may be increased by less than 0.3 mm, for example by ca. 0.1 mm, relative to the retaining surface.

In the outflow region, the transport portions 5, 15 of the rolls 134, 135 are rotated in a rotational direction 145, 147 so that the transport portions 5, 15 move at their points of contact with the material to be treated 10 in the transport direction 20.

In order to reduce the passage of liquid through the gaps formed in the outflow region by means of the rolls 134, 135 in the outflow region, the roll 134 provided above the transport plane may be configured so that the retaining surface 4 of the roll 134 may be rotated relative to the transport portion 5 of the roll 134. Similarly, the roll 135 provided below the transport plane may be configured so that the retaining surface 14 of the roll 135 may be rotated relative to the transport portion 15 of the roll 135. In the outflow region, the retaining surface 4 of the roll 134 provided above the transport plane may be rotated in a rotational direction 146 which is the opposing direction to the rotational direction 145 of the transport portion 5 of this roll 134. The retaining surface 14 of the roll 135 provided below the transport plane, may be rotated in a rotational direction 148, which opposes the rotational direction 147 of the transport portion 15 of this roll 135. In this manner, a rotation of the retaining surfaces 4, 14 may also take place in the outflow region so that the portion of the retaining surface 4 of the roll 134 provided above the transport plane, which faces straight towards the material to be treated 10, moves in the direction of the higher liquid level (to the left in FIG. 8). Similarly, the retaining surface 14 of the roll 135 may be rotated in the direction opposing the transport portion 15 so that the portion of the retaining surface 14 of the roll 135, which faces straight towards the material to be treated 10, moves in the direction of the higher liquid level (to the left in FIG. 8).

Also, the rolls 134, 135 in the outflow region may be designed so that a gap is formed with a minimum gap height of less than 0.3 mm, for example ca. 0.1 mm between the retaining surface 4, 14 and the surface of the material to be treated 10 opposing the retaining surface. For example, the transport portions may be increased by less than 0.3 mm, for example by ca. 0.1 mm, relative to the retaining surface.

Alternatively or additionally, in each case one or more blowing devices may be provided in the inflow region and/or in the outflow region of the treatment station 131, in order to remove treatment liquid emerging through the gaps by means of a fluid flow, as explained with reference to FIG. 3.

By a suitable design of the roll pairs, in the inflow region and/or outflow region it is possible to reduce an outflow of liquid through the gaps which remain during transport of the material to be treated, so that in the inflow region and/or in the outflow region of the treatment station a flow device is not provided for blowing away treatment liquid.

In the inflow region and/or in the outflow region, in each case a plurality of devices for removing or holding off treatment liquid may also be provided as explained with reference to FIGS. 4 and 5.

The devices and methods according to different embodiments make it possible in an assembly for wet-chemical treatment of material to be treated to remove or hold off a treatment liquid from the material to be treated, direct contact between the nip rolls and a useful region of the material to be treated being able to be reduced or avoided.

Numerous modifications of the embodiments shown in the figures and described in detail may be implemented in other embodiments.

Whilst, in different embodiments, retaining surfaces have been described which extend in the width direction of the material to be treated substantially at the same height transversely to the material to be treated, the gap-forming retaining surface may also be configured so that the cross section of the gap, in particular the gap height, alters in the width direction of the material to be treated. For example, the retaining surface in the width direction of the material to be treated may be concave, so that the gap formed is higher in the middle of the material to be treated than on the edges, depending on the position in the width direction of the material to be treated.

Whilst the different embodiments may be used, in particular, in treatment assemblies in which the material to be treated is transported continuously and in a horizontal transport plane, embodiments may also be used in assemblies in which the material to be treated is transported in a vertical transport plane. For example, a combination of a gap-forming retaining surface and flow device may also be used for accumulating liquid, when the material to be treated is transported in a vertical transport plane.

Whilst the use of devices has been described for removing or holding off treatment liquid in an inflow region and/or in an outflow region of a treatment station within the context of embodiments, such a device may also be used inside a treatment unit in order to displace liquid, for example for improved exchange of material.

The devices and methods according to the various embodiments may, for example, be used in the production of circuit boards, such as printed circuit boards, without their use being limited thereto.

LIST OF REFERENCE NUMERALS

1 Device for removing treatment liquid
2 Roll
3 Further roll
4 Retaining surface
5, 6 Raised edge portion
7 Shaft
8 Gap
9 Minimum gap height
10 Material to be treated
11 Useful region
12 Edge region
14 Further retaining surface
15, 16 Raised edge portion
17 Shaft
18 Further gap
19 Minimum gap height
20 Transport direction
21 Treatment liquid
22 Liquid level
23 Treatment liquid
24 Liquid level
25, 26 Rotational direction
31 Device for removing treatment liquid
32 Flow device
33 Fluid flow
34 Treatment liquid
41 Outflow region 42 Treatment region
43, 44, 45 Device for removing treatment liquid
46 Base
47, 48 Barrier
51, 52 Roll
53, 55 Roll
54, 56 Flow device
57, 59 Roll
58, 60 Flow device
61 Opening
71, 72 Liquid level
73 Treatment liquid
74 Difference in levels
81 Outflow region
82 Treatment region
83 Device for removing treatment liquid
84-86 Roll
91, 92 Liquid level
93 Treatment liquid
94 Pump
95 Liquid flow
96 Opening
97 Difference in levels
101 Device for removing treatment liquid
102 Roll
103 Further roll
104 Retaining surface
105 Set-back edge portion
106 Further retaining surface
107 Set-back edge portion
108, 109 Retaining rail
111 Device for removing treatment liquid
112, 113 Insert
114, 117 Side surface
115, 118 Gap
116, 119 Chamfer
131 Treatment station
132-135 Roll
136 Liquid level
141-148 Rotational direction
200 Treatment station
201 Inner container
202 Outer container
203 Material to be treated
204 Transport direction
206, 207 Flow nozzle
208 Treatment liquid
209 Level in outer container
210 Pump
211, 212,
214, 216 Transport roll pair
213, 215 Nip roll pair

The invention claimed is:

1. An assembly for treating a planar material to be treated, the assembly being designed to apply on at least one surface of the material to be treated a treatment liquid or to immerse the material to be treated in a treatment liquid, and the assembly being designed to transport the material to be treated along a transport path, the assembly comprising:
    a treatment station, which is configured to accumulate the treatment liquid;
    an application device, which is configured to apply the treatment fluid to the planar material to be treated;
    a device for removing or holding off treatment liquid from the planar material to be treated, the device being provided in an inflow region of the treatment station, the device comprising a retaining surface for holding back the treatment liquid and being arranged relative to the transport path of the material to be treated so that the device forms a gap between the retaining surface and a surface of the material to be treated transported along the transport path; and
    a further device for removing or holding off treatment liquid from the planar material to be treated, the further device being provided in an outflow region of the treatment station, the further device comprising a retaining surface for holding back the treatment liquid and being arranged relative to the transport path of the material to be treated so that the further device forms a gap between the retaining surface and the surface of the material to be treated transported along the transport path;
    the assembly being designed to rotate in opposite directions the retaining surface of the device provided in the inflow region of the treatment station and the retaining surface of the further device provided in the outflow region of the treatment station, wherein the retaining surface of the device provided in the inflow region and the retaining surface of the further device provided in the outflow region which are rotated in opposite directions are both located above a transport plane of the material to be treated, or both located below the transport plane of the material to be treated.

2. An assembly according to claim 1, wherein the retaining surface of the device provided in the inflow region of the treatment station and/or the retaining surface of the further device provided in the outflow region of the treatment station is formed on a roll, the treatment liquid being accumulated on both sides of the roll, and a difference in levels of the treatment liquid being set on opposing sides of the gap.

3. An assembly according to claim 1, wherein the device provided in the inflow region of the treatment station and/or the further device provided in the outflow region of the treatment station comprises:
    a flow device spaced apart from the retaining surface which is designed to remove, by means of a fluid flow, the treatment liquid from the material to be treated.

4. An assembly according to claim 3, the flow device being designed and arranged such that the fluid flow does not pass through the gap.

5. An assembly according to claim 1,
    wherein the retaining surface of the further device provided in the outflow region is formed on a roll which is set in rotation so that a part of a surface of the roll which is closest to the material to be treated moves in a direction which opposes a transport direction of the material to be treated.

6. An assembly according to claim 1,
    wherein the retaining surface of the device provided in the inflow region of the treatment station is formed on a central portion of a roll, wherein the roll comprises axial end portions which engage retaining rails mounted to edges of the material to be treated.

7. An assembly according to claim 6,
    wherein the axial end portions have a diameter which is smaller than a diameter of the central portion of the roll on which the retaining surface is formed.

8. An assembly according to claim 6,
    wherein the retaining surface of the further device provided in the outflow region of the treatment station is formed on a central portion of a further roll, wherein the further roll comprises axial end portions which engage the retaining rails mounted to the edges of the material to be treated.

9. An assembly according to claim 1,
wherein the retaining surface of the device provided in the inflow region of the treatment station is formed on a roll which further comprises transport portions configured to transport the material to be treated,
wherein the retaining surface has a diameter which is smaller than a diameter of the transport portions, and
wherein the retaining surface is rotatable relative to the transport portion.

10. An assembly according to claim 9,
wherein the transport portions and the retaining surface are coaxially arranged.

11. An assembly according to claim 1,
wherein the retaining surface of the further device provided in the outflow region of the treatment station is formed on a roll which further comprises transport portions configured to transport the material to be treated,
wherein the retaining surface has a diameter which is smaller than a diameter of the transport portions, and
wherein the retaining surface is rotatable relative to the transport portion.

12. An assembly according to claim 11,
wherein the transport portions and the retaining surface are coaxially arranged.

13. An assembly according to claim 1,
wherein the device provided in the inflow region of the treatment station further comprises:
   a second retaining surface, wherein the retaining surface of the device provided in the inflow region of the treatment station and the second retaining surface of the device provided in the inflow region of the treatment station are arranged on opposing sides of the transport plane; and
wherein the device provided in the outflow region of the treatment station further comprises:
   a second retaining surface, wherein the retaining surface of the device provided in the outflow region of the treatment station and the second retaining surface of the device provided in the outflow region of the treatment station are arranged on opposing sides of the transport plane.

14. An assembly according to claim 13,
wherein the second retaining surface of the device provided in the inflow region of the treatment station and the second retaining surface of the device provided in the outflow region of the treatment station are arranged on a same side relative to the transport plane, and
wherein the assembly is configured to rotate in opposite directions the second retaining surface of the device provided in the inflow region of the treatment station and the second retaining surface of the device provided in the outflow region of the treatment station.

* * * * *